(12) United States Patent
Macleod

(10) Patent No.: US 12,235,366 B2
(45) Date of Patent: Feb. 25, 2025

(54) DECODER FOR A RECEIVER

(71) Applicant: QINETIQ LIMITED, Farnborough (GB)

(72) Inventor: Malcolm David Macleod, Malvern (GB)

(73) Assignee: QINETIQ LIMITED, Farnborough (GB)

( * ) Notice: Subject to any disclaimer, the term of this patent is extended or adjusted under 35 U.S.C. 154(b) by 351 days.

(21) Appl. No.: 17/921,054

(22) PCT Filed: May 7, 2021

(86) PCT No.: PCT/EP2021/062153
§ 371 (c)(1),
(2) Date: Oct. 24, 2022

(87) PCT Pub. No.: WO2021/224459
PCT Pub. Date: Nov. 11, 2021

(65) Prior Publication Data
US 2023/0176232 A1    Jun. 8, 2023

(30) Foreign Application Priority Data
May 7, 2020   (GB) ..................................... 2006748

(51) Int. Cl.
*G01S 19/24* (2010.01)
*G01S 19/30* (2010.01)
(Continued)

(52) U.S. Cl.
CPC ............ *G01S 19/243* (2013.01); *G01S 19/30* (2013.01); *G01S 19/37* (2013.01); *H03M 13/235* (2013.01); *H03M 13/611* (2013.01)

(58) Field of Classification Search
CPC ........ G01S 13/931; G01S 13/42; G01S 13/56; G01S 13/60; G01S 13/66
See application file for complete search history.

(56) References Cited

U.S. PATENT DOCUMENTS 6,167,552 A * 12/2000 Gagnon ................ H03M 13/43
714/760
8,397,150 B1 * 3/2013 Nieminen ............. H04L 9/0656
714/795

FOREIGN PATENT DOCUMENTS

WO    2009/053490 A2    4/2009

OTHER PUBLICATIONS

Crosta et al., "A simplified convolutional decoder for Galileo OS: performance evaluation with a Galileo Mass-Marke"eceiver in live scenario," 8th ESA Workshop on Satellite Navigation Technologies and European Workshop on GNSS ignals and Signal Processing (NAVITEC), IEEE, Dec. 14, 2016, pp. 1-8 (Year: 2016).*

(Continued)

*Primary Examiner* — Peter M Bythrow
*Assistant Examiner* — Nazra Nur Waheed
(74) *Attorney, Agent, or Firm* — Oliff PLC

(57) ABSTRACT

A non-systematic convolutional decoder of a convolutionally encoded multi-level data stream includes a shift register and two or more paths of exclusive-OR (XOR) gates, arranged to reconstruct an original input information stream, each path having a quantiser arranged to quantise the signal to two levels, and a set of XOR gates arranged to match an encoding path in an associated convolutional encoder, and a selector arranged to feed an output from each path to a single input of the shift register. If the paths have differing values at their output, the selector may choose the value from the path based upon a function of the multi-level signals associated with each path, such as the path with the largest absolute signal level. The decoder provides a simple means for decoding signals while allowing the signal to also or instead be decoded using e.g. a Viterbi decoder if higher performance is required.

11 Claims, 4 Drawing Sheets

(51) Int. Cl.
  *G01S 19/37*   (2010.01)
  *H03M 13/00*   (2006.01)
  *H03M 13/23*   (2006.01)

(56) References Cited

OTHER PUBLICATIONS

Crosta et al., "A simplified convolutional decoder for Galileo OS: performance evaluation with a Galileo Mass-Market Receiver in live scenario," 8th ESA Workshop on Satellite Navigation Technologies and European Workshop on GNSS Signals and Signal Processing (NAVITEC), IEEE, Dec. 14, 2016, pp. 1-8.
Proakis, John G., "5.2.10 Interleaving of Coded Data for Channels with Burst Errors," Digital Communications, 2nd Edition, 1989, pp. 440-441.
Feldman et al., "A Fast Maximum-Likelihood Decoder for Convolutional Codes," IEEE, 2002, pp. 371-375.
Anderson, John B., "Limited Search Trellis Decoding of Convolutional Codes," IEEE Transactions on Information Theory, Sep. 5, 1989, vol. 35, No. 5, pp. 944-955.
Feb. 4, 2021 Search Report issued in British Patent Application No. 2006748.4.
Jul. 19, 2021 International Search Report issued in International Patent Application No. PCT/EP2021/062153.
Jul. 19, 2021 Written Opinion of the International Searching Authority issued in International Patent Application No. PCT/EP2021/062153.

\* cited by examiner

DECODER FOR A RECEIVER

The present invention relates to methods and apparatus for processing signals, and more particularly to methods, systems, devices and apparatus for decoding signals in a receiver that have been encoded for transmission using a convolutional encoder.

Convolutional encoding of signals is a commonplace technique used as part of the transmission of digital signals. The encoding process involves generation of parity bits, that are then transmitted from a transmitter of some type to one or more receivers as a bit stream. The parity bits allow decoding of the signal, and, depending on the exact nature of the convolutional code chosen, also allows the detection, and often also the correction of errors in the bit stream received, due to noise etc.

There are various ways to decode convolutional coded signals. One of the most popular is a Viterbi decoder. This takes the form of a "trellis" arrangement, wherein a succession of received bit pairs are supplied to successive positions in the trellis, according to the bit pattern (which may contain errors), to form a path, with a maximum likelihood path being made as the path grows.

Although it has good accuracy (in terms of providing a maximum likelihood bit stream), a disadvantage of the Viterbi decoder is the computational effort required in performing the decoding. For very low power equipment, particularly when battery operated, it can be prohibitive.

There are simpler approaches to convolutional decoding. Some of these make use of "systematic" convolutional codes, which are codes that include in the transmitted bit stream a copy of the original input data. Decoding such schemes is very straightforward, but such approaches have a limited performance when used with a full Viterbi decoder.

Non-systematic codes produce only parity bits for transmission, and don't include a copy of the original data within them. An example of a non-systematic convolutional encoder is shown in FIG. 1. This is an encoder as used in encoding signals sent on the US Global Positioning System (GPS) L2C and L5 channels. The encoder comprises of a shift register 10 having six bit sized storage bins, storing bits t-1 ... (t-6) sequentially in its six bins. Along with a current bit (at given time t), the encoder therefore processes seven bits simultaneously before shifting the current bit into the first bin. For each data bit entered, two parity bits are produced as an output. These are produced by two functions, each being an exclusive OR (XOR) of certain bits in the register (including the input bit at time t), as determined by polynomials 171 and 133 (octal), which are known as the G1 and G2 polynomials respectively. Thus, in binary, the bits set to 1 are XORed together to produce the two output bits. Each time an input bit is introduced (and the current bits shifted to the next bin), the two output bits produced by the XOR process are sent for transmission. This is therefore an example of a convolutional code which then needs to be decoded at the receiver in a decoder (such as the Viterbi decoder mentioned above).

Some convolutional decoding schemes are called "hard" decoding schemes, whereas others are known as "soft" decoding schemes. In a hard decoding scheme a received signal is passed through a thresholding circuit to convert it into a binary signal. The subsequent decoding (e.g. Viterbi decoding) is then performed on this binary signal. It will be appreciated that during the thresholding of the signal, information on the magnitude of the incoming signal is thrown away. For example, a signal just a small amount on one side of the threshold is recorded as being the same as a signal a significant amount on that same side of the threshold.

In a soft decoding scheme, this threshold does not take place, and the signal processing is carried out on the pre-threshold signal. Thus, magnitude information otherwise thrown away in a hard decoding scheme is used to produce a final output value, which generally leads to a better result (i.e a lower bit error rate for a given carrier to noise input signal).

Some current techniques that attempt to provide a low power convolutional decoder exist. See Beale, MW and Kingsbury, NG (1993) Improving the M-algorithm for reduced-state decoding of convolutional codes. Proceedings of the International Symposium on Communications Theory and Applications, Ambleside, UK pp. 2543-2560.

See also Paolo Crosta, Gabriele Pirazzi, "A simplified convolutional decoder for Galileo OS: performance evaluation with a Galileo Mass-Market Receiver in live scenario", IEEE, 2016.

According to a first aspect of the present invention there is provided a decoder for decoding a convolutionally coded signal received by a receiver, the signal being represented as a multilevel signal, where the number of levels is greater than two, the decoder comprising:

a) a shift register having an input;

b) a first one-bit quantizer, arranged to receive a part of the multilevel signal as derived from a signal produced by a first polynomial during generation of the coded signal in a transmitter (a first polynomial-derived multilevel signal), and to produce a first quantized binary bit stream therefrom;

c) a first set of at least one exclusive OR gate(s) arranged to receive as input the first quantized binary bit stream, and to receive as further input(s) from bins from the shift register as determined by the first polynomial, the set of XOR gates producing a first set output bit;

d) a second one-bit quantizer, arranged to receive a part of the multilevel signal as derived from a signal produced by a second polynomial during a coding stage in a transmitter (a second polynomial-derived multilevel signal), and to produce a second quantized binary bit stream therefrom;

e) a second set of at least one exclusive OR gate(s) arranged to receive as input the second quantized binary bit stream, and to receive as further inputs bins from the shift register as determined by the second polynomial, the set of XOR gates producing a second set output bit;

f) a selector, having as inputs the first and second polynomial-derived multilevel signals and the first and second set output bits, and being arranged to provide as output to the shift register either:

i) if the value of the first and second set output bits are the same, then that value, or ii) if the value of the first and second set output bits are different, then either the value of the first or second set output bit dependent upon a function of the first and second polynomial derived multi-level signals;

wherein the decoder is further arranged to provide as an output a bit value provided to the input of the shift register.

Conveniently, in some embodiments the function in (f)(ii) is one where the first set output bit is chosen if the absolute value of the first polynomial-derived multilevel signal exceeds the absolute value of the second, or otherwise the second set output bit is chosen. Thus, effectively, the bit associated with the largest absolute value of the polynomial-derived multi-level signal is used.

In other embodiments other functions of the first and second polynomial-derived multi-level signals may be used. These may, for example, be based upon mean values of previously received signals.

Embodiments of the invention therefore provide a decoder that is able to decode a convolutionally coded signal using an approach that is simpler than a Viterbi decoder, and hence requires less power to decode. A further advantage is that the decoder is also able to work on signals that are designed to be decoded using a Viterbi decoder. Therefore, it provides an alternative decoding scheme, allowing a signal to be decoded in different ways, according to the availability of electrical power, processing capability, and accuracy requirements.

The decoder may form part of a receiver. The receiver may be a radio receiver, or a receiver arranged to receive other signals, such as optical signals, sonic signals, or signals sent over cables. In some embodiments the receiver may be a global navigation satellite system (GNSS) receiver. In some embodiments the receiver will have signal amplification, signal filtering, downconversion and/or demodulation functions taking place prior to the decoder. In such embodiments, the multilevel signal provided to the decoder will be an output from any such amplification, filtering downcoversion and/or demodulation stages. Embodiments of the invention have been found to be of particular utility in GNSS applications, and in other applications where a block error rate (as opposed to a maximum likelihood bit error rate) is a key consideration.

Note that the shift register stores bits of information in a set of bins, (typically 1 bit in each bin), and has an input. When a new input bit is clocked into the shift register into an input bin, the bit currently in that input bin is moved to the next adjacent bin. The bit in that next adjacent bin is moved to a third bin, etc. so that each bit in the shift register is moved to a next bin across when a new bit is provided as an input. A bit value at an end of the shift register furthest from the input is discarded as a new bit is inputted to the shift register.

Note that the bit value provided as an output of the decoder may be the bit value as supplied to the first bin of the shift register, or may be a bit taken from a subsequent bin of the shift register.

In some embodiments of the invention, the decoder may have one or more additional quantizers, and sets of exclusive OR gates, and inputs to the comparator to allow convolutional codes generated with more than two polynomials to be decoded. Such embodiments may therefore provide the flexibility to be used with more complex convolutional coding schemes.

In some embodiments the multi-level polynomial-derived signals provided by the receiver functions, such as those mentioned above, to the decoder may be analogue signals.

Alternatively, in other embodiments, the multilevel signals provided as an input to the decoder will have been digitised as part of an earlier function in the receiver (such as a digitiser). In such embodiments the multilevel signal is a digitised signal having at least three quantization levels. Thus, it will, when the signal is a binary signal, be represented by more than one bit.

It will be understood by the normally skilled person in the art that the set of exclusive OR gates may be implemented as a multiple input 1-bit half-adder, without a carry bit.

In some embodiments the selector may be adapted to have memory (a discrepancy register), in which is stored a value representing whether there was a discrepancy in the previous inputs from the first and second exclusive-OR (XOR) sets, where a discrepancy is a difference in the values of the bits from the first and second XOR sets. In such embodiments, when a bit comparison is made on a current input from the first and second XOR set outputs, if the result is a discrepancy, then the discrepancy register is checked to see if the previous comparison between first and second XOR set outputs, and if there was (i.e. that there are two successive discrepancies between first and second XOR set outputs), the decoder is arranged to invert the bit in the shift register associated with that previous discrepancy.

Thus, in such embodiments, the selector is adapted to have a discrepancy register, comprising of a memory store in which is stored a value representing whether there was a discrepancy in the immediately previous input from the first and second XOR sets, and further wherein the decoder is adapted to invert a bit in the shift register associated with the immediately previous input to the shift register as output from the selector, if there is a current discrepancy between the outputs of the first and second XOR sets and the discrepancy register also indicates a discrepancy.

Thus, the effect of such an embodiment is that if two discrepancies are detected in a row, then the reversal of the bit in the shift register associated with the previous discrepancy (which will be at the first position in the shift register), has the effect of, if that first position in the shift register has an output to a single XOR gate forming part of the first or second set, reversing one of the inputs to the selector, which in turn has the effect of removing the current discrepancy.

Such embodiments can prove to be advantageous, due to the nature of the input data, and how adjacent errors might arise, as explained later.

According to a second aspect of the invention there is provided a method for decoding a signal that has been convolutionally coded by a transmitter and received by a receiver, the signal being represented as a multilevel signal, where the number of levels is greater than two, the method comprising the steps of, a) quantizing, in a first one-bit quantizer, a part of the multilevel signal as derived from a signal produced by a first polynomial during generation of the coded signal in a transmitter (a first polynomial-derived multilevel signal), producing a first quantized binary bit stream therefrom;

b) feeding the bit stream from (a) into a first set of at least one exclusive OR gate(s), the set receiving further input(s) from bins of a shift register as determined by the first polynomial, the set of XOR gates producing a first set output bit;

c) quantizing, in a second one-bit quantizer, a part of the multilevel signal as derived from a signal produced by a second polynomial during a coding stage in a transmitter (a second polynomial-derived multilevel signal), and producing a second quantized binary bit stream therefrom;

d) feeding the bit stream from (c) into a second set of at least one exclusive OR gate(s), the set receiving as further inputs bins from the shift register as determined by the second polynomial, the set of XOR gates producing a second set output bit;

e) selecting using a selector, having as inputs the first and second polynomial multilevel signals and the first and second set output bits, the first set output bit if the absolute value of the first polynomial multilevel signal exceeds the absolute value of the second, or otherwise the second set output bit, and providing the selected bit as an input to the shift register;

f) providing as a decoded output the bit output by a selected stage of the shift register.

In step (e), if the first and second set output bits are the same, then the value of either the first or second set output bits may be selected.

In some embodiments the method may further comprise storing, in a discrepancy register, a record of whether or not there is difference in the output of the first and second set output bits; and examining the discrepancy register and, if it indicates that the immediately prior outputs from the first and second set output bits differed, and also the current outputs of the first and second set output bits differ, inverting within the shift register the immediately prior bit provided to the input of the shift register.

According to a third aspect of the present invention there is provided a receiver incorporating a novel decoder as described herein, or arranged to implement a novel method of decoding as described herein. The receiver may be a GNSS receiver, as the novel decoder presented herein is particularly suited to such an application. It will be understood however that the novel decoder may be used in other applications, such as those mentioned elsewhere in this document.

According to a fourth aspect of the present invention there is provided a computer program product comprising instructions that, when executed on a processor, implement a method of convolutional decoding as presented herein. The computer program product may be arranged to be executed on a processor having attached thereto memory, and input/output functions to allow data representing a signal to be processed according to the novel method.

Embodiments of the invention will now be described, by way of example only, with reference to the following Figures, of which:

Figure 1:
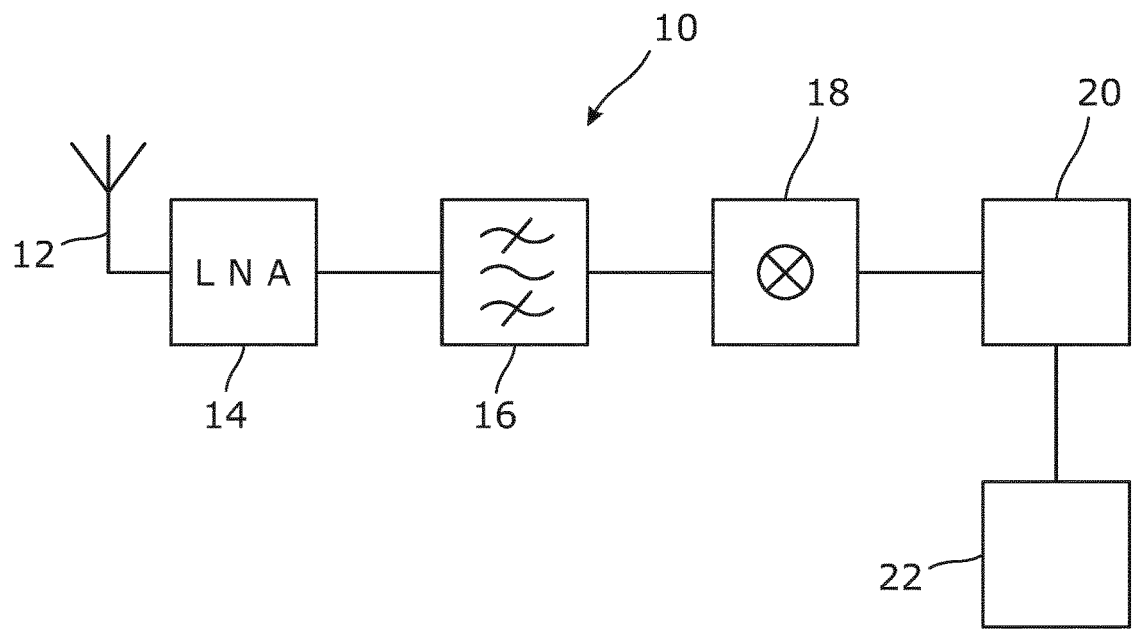
FIG. 1 shows a block diagram of a receiver incorporating a decoder according to an embodiment of the invention.

FIG. 1 shows a simplified, high-level block diagram of a receiver, incorporating a convolutional decoder which may be of the type described herein, or may be a prior art decoder. A receiver 10 comprises of an antenna 12, a low noise amplifier 14, a bandpass filter 16 and a downconverter 18, a convolutional decoder 20, and further processing functions 22. A signal, received at the antenna 12 is passed to the amplifier, where it is amplified, and then filtered in filter 16. The downcoverter takes the filtered signal and converts it into a baseband signal A digitiser (not shown) converts the received signal from an analogue signal to a digital signal at a convenient point in the receiver (which point will be dependent upon the purpose and exact structure of the receiver). The receiver produces a signal that is supplied to the decoder, in this case a multi-level digital signal, although it will be appreciated that some receivers may supply an analogue signal to the decoder.

Not shown are various other elements of a system, such as any demodulation, power supplies, local oscillators etc. that would likely be present in receivers in which the invention would typically be used (such as a GNSS receiver). In a GNSS receiver, the demodulation may well comprise of a correlator, arranged to correlate the received signal with a reference signal. Following the decoding process, the data provided by the decoder may be used for its intended purpose, or the purpose intended by the receiver, as indicated by the further processing functions 22. This may be, for example in a GNSS receiver, the computation of position, velocity and/or time. The details of any such processing after the decoding stage are not relevant to this invention and are not discussed in detail further.

Figure 2:
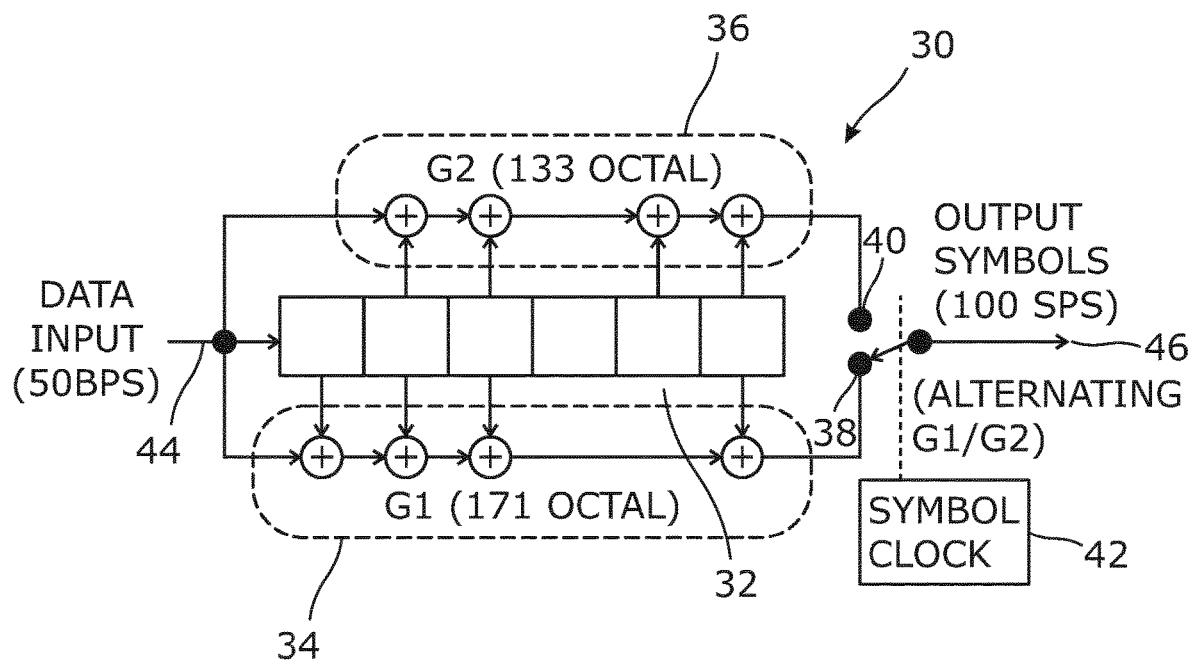
FIG. 2 shows a block diagram of a convolutional encoder of the type used with the current US Global Positioning System (GPS), and is hence prior art.

FIG. 2 shows an example of a prior art convolutional encoder 30, as may be used to generate a signal for transmission. The encoder shown implements the encoding as used on GPS L2C and L5 signals. Encoder 30 comprises of a six-bit shift register 32, with two sets of XOR gates, 34, 36. The first set of XOR gate 34 is arranged to implement generator-polynomial 133 (Octal), whereas the second set of XOR gates 36 is arranged to implement generator-polynomial 171 (Octal). It will be understood by the normally skilled person that the polynomials dictate the connections to inputs of the XOR gates from the shift register. Each set of XOR gates provides a single bit output, 38, 40, which are sent in alternating fashion for transmission, timed by symbol clock 42, in a transmitted signal (this being a polynomial-derived signal at a point before transmission to the receiver). Data to be encoded is fed to data input 44, and an output stream of data is sent for transmission (or further coding as required) at output 46. The data input feeds the shift register input, and also the sets of XOR gates implementing the generator polynomials, and is clocked through the shift register in known fashion. Thus, for every information bit fed into the encoder, two coded bits are generated for transmission. The transmitted signal is subjected to noise and interference before being received at a receiver (e.g. 10). The receiver is arranged, in its processing prior to the decoder (i.e. upstream thereof), to provide two streams of data to the decoder, each corresponding to one of the polynomial outputs of the transmitter (i.e. a polynomial-derived multilevel signal). Synchronisation information transmitted as part of the signal is used to establish a path for the two streams to appropriate inputs of the decoder.

Figure 3:
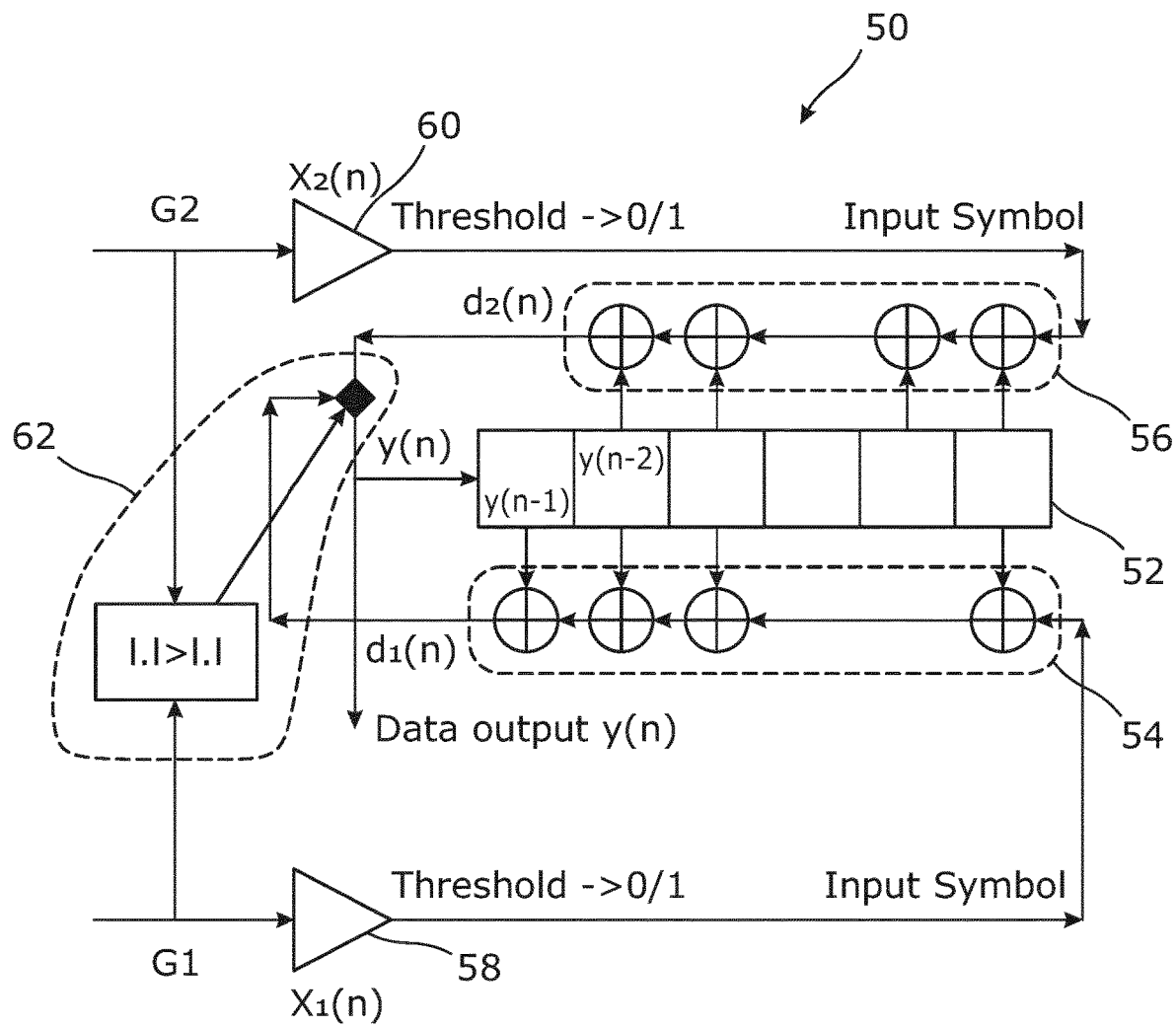
FIG. 3 shows a block diagram of a decoder according to a first embodiment of the invention.

FIG. 3 shows a first embodiment of the present invention. A convolutional decoder 50 is adapted to decode received signals that have been previously split into two data streams, namely a first data stream G1 comprising a polynomial-derived multilevel signal corresponding to a first polynomial, and a second data stream G2 comprising a polynomial-derived multilevel signal corresponding to a second polynomial.

The decoder 50 is arranged to decode a signal produced by the encoder of FIG. 2, and hence its arrangement (as described below) is specific to a signal produced by such an encoder (i.e. generated using the generator polynomials mentioned in relation to FIG. 2). The decoder comprises of a shift register 52, a first set of XOR gates 54, a second set of XOR gates 56, a first 58 and a second 60 thresholding circuit, each associated with the first 54 and second 56 sets of XOR gates respectively, and a selector 62.

Multilevel signal G1 is fed to thresholding circuit 58, where the multilevel input is converted to a binary signal based upon its relation to a fixed threshold. The binary signal from the threshold circuit is input to the set of XOR gates 54, which have further inputs from bins of the shift register 52 as determined by the first generator polynomial used to create that part of the signal during the encoding step.

Together, the XOR gates functionally act as a 1 bit half-adder. The output from the set of XOR gates 54 provides a first input $d_1(n)$ to selector 62.

In similar fashion, multilevel signal G2 is fed to thresholding circuit 60, where the multilevel input is converted to a binary signal based upon its relation to a fixed threshold within the circuit. The binary signal from the threshold circuit is input to the set of XOR gates 56, which have further inputs from bins of the shift register 52 as determined by the second generator polynomial used to create that part of the signal during the encoding step. Again the XOR gates function as a 1 bit half-adder with their output providing a second input $d_2(n)$ to selector 62.

Multilevel signals G1 and G2 are also provided as inputs to the selector 62. The purpose of selector 62 is to choose one of its inputs $d_1(n)$ or $d_2(n)$ to be provided to the input of shift register 52. In making the selection, it first looks to see whether $d_1(n)$ and $d_2(n)$ are different. If they are the same value (either both 0 or both 1) then it passes the value into the input of shift register 52 (of course shifting along the other bits already in the shift register in the usual way). If the values of $d_1(n)$ and $d_2(n)$ are different, then this means that there has been an error at some point in the transmission or reception process. The selector then chooses which input to supply to the shift register input. To do this it looks to see which of the G1 and G2 signals currently input to it have the largest magnitude, and it selects the bit associated with the one having this largest magnitude to be the input to the shift register.

By using information within the incoming signals G1 and G2 before they are passed into their respective thresholding functions, then the decision on choosing between values of $d_1(n)$ or $d_2(n)$ that differ is effectively done as a "soft" decision, akin to the soft Viterbi decoder. At that stage (before being passed through the thresholding function) they are multilevel signals (which may be analogue or digital, and, if digital, will be signals having more than two levels, and hence be multiple bit signals), and so the additional information contained in the pre thresolding data is used to aid in deciding between conflicts.

As further explanation, it will be understood that a convolutional decoder is only successful if all the output data bit decisions are correct, so any "previous decisions" (i.e. data that has been previously fed into the shift register) do not provide any help in deciding which of the pair of new input symbols gives a better estimate of the latest output bit. Signals may be received in the receiver as bipolar voltages, say nominally +q V for 0, say, and −q V for 1, which will be corrupted by noise.

If an input symbol voltage G1 or G2 is closer to zero, the probability that its sign is incorrect is greater. As an example, if a voltage of −0.01v is received, then it will be decoded to a 1 in a thresholder, as will a received voltage of −0.9v, but it is clear that, in a system looking at the magnitude of an input to determine its binary value, the larger magnitude signal (here −0.9v) is, with more certainty, more likely to represent a transmitted 1 rather than a 0.

Hence the input value (the G1 symbol or the G2 symbol) that is larger in magnitude is more likely to give a correct estimate of the latest data bit.

Embodiments of the invention are particularly useful where a decoder is desired that requires less computational power to operate than a traditional Viterbi decoder. However the invention has the advantage that it is able to decode signals that are intended for decoding on a Viterbi decoder without any modification to such signals. Therefore, it introduces the option of having a low power receiver that uses embodiments of the invention, and a separate high power receiver that may use a full Viterbi decoder, for reception and processing of the same signals. For example, where the decoder is used to decode GNSS signals, the lower power decoder receiver (as described herein) may be, for example, built into a mobile phone, or similar device, where great position, velocity and timing (PVT) accuracy is generally not required but where battery life is critical, and a high power (e.g. Viterbi) decoder may be used for example in an agricultural or surveying GNSS receiver where PVT accuracy is more critical.

Viterbi decoding provides a maximal likelihood of decoding a convolutional encoded input stream. It is thus an optimal solution at producing the lowest bit error rate (BER) for an input signal having a given energy-per-symbol (Es) to noise spectral density (N0) (Es/N0) input. However, it has been appreciated by the inventor that in some applications, the BER is less critical to system performance than a frame error rate (FER). In such applications, data may be transmitted in frames each comprising multiple bits, where any non-correctable error within a frame means that the frame must be rejected. One such application is in decoding a GNSS navigation (PVT) message. A frame may comprise, for example 300 user data bits.

Figure 4:
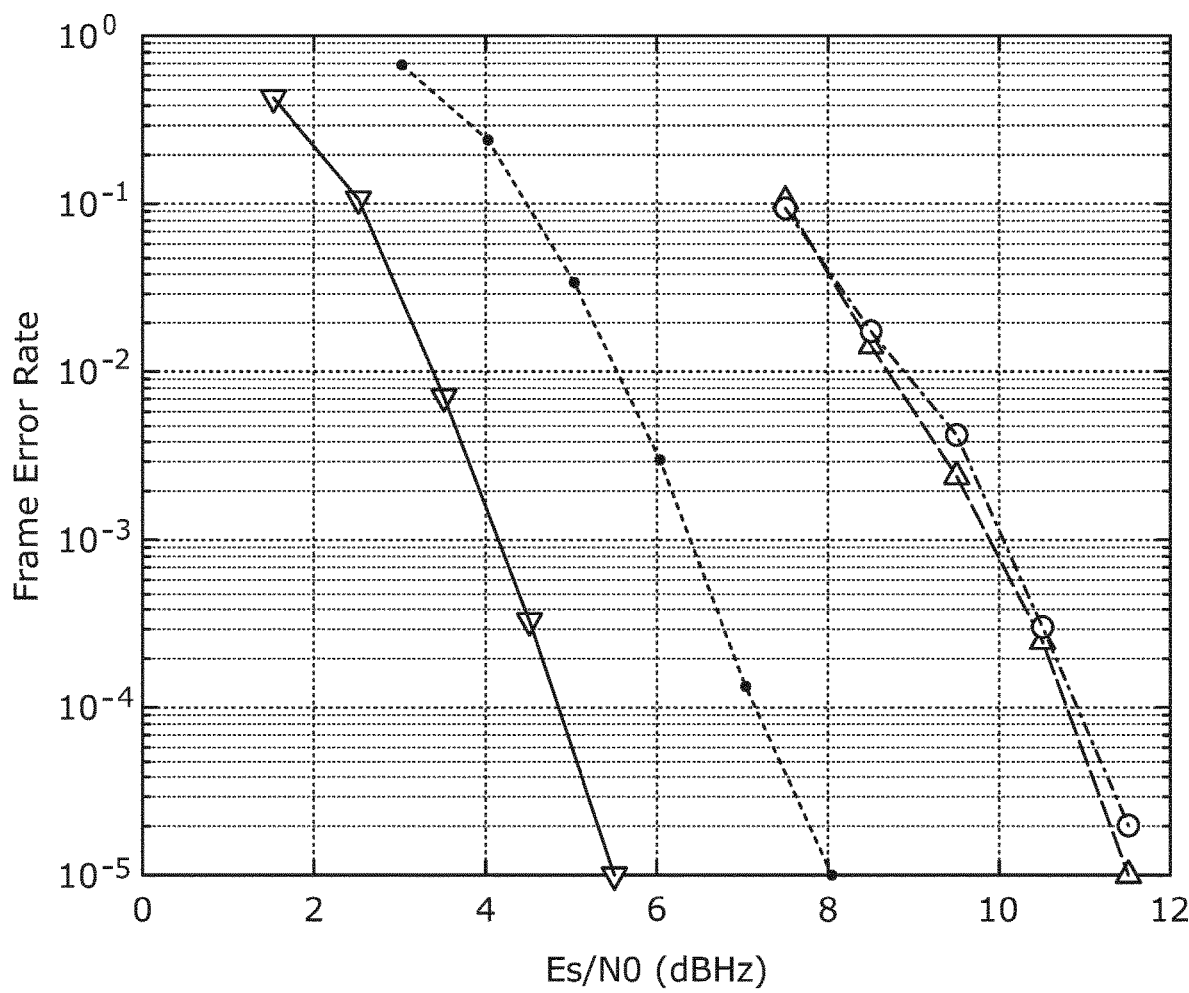
FIG. 4 shows a graph of relative performance of two embodiments of the invention, along with that of a hard and soft Viterbi decoder, using simulated data.

Simulations of the embodiment of FIG. 3 have been performed using Matlab®, in comparison with both hard and soft Viterbi decoders under similar carrier to noise conditions. A Graph showing the results of the simulations is shown in FIG. 4. The graph shows four different plots. The plots show decoding performances of a Monte-Carlo simulation of 30000 input frames of data per data point plotted. Each frame comprised of 300 information bits, plus 6 tail bits, which were encoded using the convolutional encoder of FIG. 3, and then decoded by different methods as described below. The x-axis is a measure of the energy-per-symbol/noise power spectral density, Es/N0, while the y-axis is the frame error rate.

For reference purposes two plots of standard Viterbi decoding methods are shown, showing simulated soft and hard Viterbi decoding of the data. The plot with downwardly directed triangles marking the data points towards the left of the graph is a simulation of soft Viterbi decoding, whilst the one nearest to it, with data points indicated by dots, is the hard Viterbi decoding simulation. It is seen that soft Viterbi decoding provides a better performance than hard Viterbi decoding, for reasons explained above. The plot with data points marked by circles shows the performance of the embodiment of FIG. 3 working on simulated data. It can be seen that it does not perform as well as either of the Viterbi decoders, but that is to be expected. It does however operate on the same input data, so giving a system designer the choice of whether to use the novel method as taught herein (for lower power operation of the hardware), or a Viterbi decoder for higher decoding performance, at the expense of higher power consumption.

It will be appreciated by a normally skilled person that an alternative to the invention, whereby transmitted data is not encoded in a convolutional encoder, would allow for very simple processing within a receiver, but would not allow for any error correction to take place (as no error correction bits would be generated), and would not allow for different levels of decoding (e.g. a: the relatively low power version as shown in embodiments of the invention disclosed here, or b: the higher accuracy Viterbi decoder) to be used on the same transmitted data depending upon the application to which the data is to be put. No amendment of the signal needs to take place in the transmitter according to which receiver is used to receive the signal.

Figure 5:
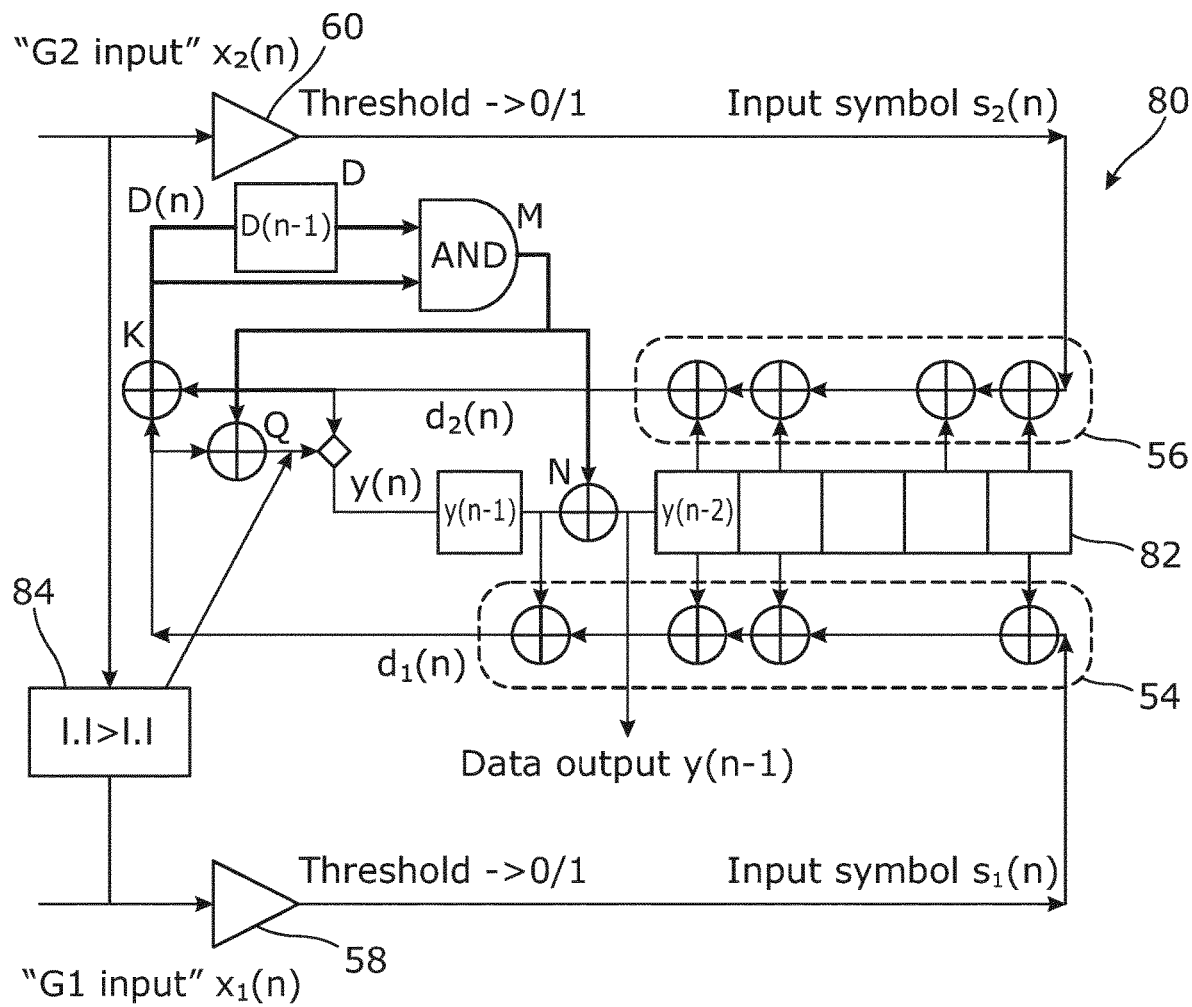
FIG. 5 shows a block diagram of a second embodiment of the invention.

The plot with data points marked by upwardly directed triangles shows the performance of a slightly modified version of the decoder of FIG. 3, details of which are shown in FIG. 5. This shows a decoder 80 that is similar to that shown in FIG. 3, and which works in a broadly similar fashion. It is arranged to decode, with its particular layout of sets of XOR gates 54 and 56, signals encoded by polynomials 171 and 133 (octal) as before. Those elements that work identically to that of FIG. 3 are given the same reference numbers. As before, multi-level (i.e. levels >2) data arrives at the G1 and G2 inputs, and the multi-level data passes through threshold circuits 58, 60 respectively before being provided as inputs to sets of XOR gates 54 and 56 respectively. The sets of XOR gates 54, 56 also take inputs from bins of shift register 82, the bins being selected according to the generator polynomial used in the coding of the signal during a transmission stage. The shift register 82 is similar to shift register 52 in FIG. 3, except for having an XOR gate between the first storage bin y(n-1) and y(n-2), which is used to invert data traversing from one to the other in some circumstances as detailed below.

The outputs $d_1(n)$ and $d_2(n)$ of each set of XOR gates 56, 60 are provided to a selector circuit that comprises of a comparison unit 84, along with various logic gates. The comparison unit 84 again has inputs from the multi-level signals G1 and G2, and its primary task is to select a bit y(n) to be provided as the input to shift register 82. As in the previous embodiment, given inputs $d_1(n)$ and $d_2(n)$, if $d_1(n)$ =$d_2(n)$, then the value of the bit at $d_1(n)$ (or indeed $d_2(n)$ as it will be the same value) is fed to the input of the shift register as bit y(n). The bits currently in the shift register are shifted along in the usual manner.

If there is a discrepancy in $d_1(n)$ and $d_2(n)$, i.e. they differ in their values, then the selector looks at the magnitudes of the inputs G1 and G2, and selects either $d_1(n)$ or $d_2(n)$ to be the next y(n) dependent on which of G1 or G2 has the largest magnitude. This is so far the same as previously described in relation to FIG. 3.

The above paragraph assumes that there was no discrepancy detected in the immediately previous $d_1(n-1)$ and $d_2(n-1)$. The selector circuit 84 differs from the selector 52 as previously described, in having a 1 bit register, called a Discrepancy register (D). The purpose of this register is made clear below. Given the assumption in the previous paragraph that $d_1(n-1)=d_2(n-1)$, then XOR gate K will have presented a "0" as input to the register D. Thus, due to the register D having a "0" stored therein, and presenting this to a first input of AND gate M, the output of the AND gate M will be a "0", and hence XOR gate N (which has an input from the output of the AND gate M) will act to transfer data from the first bin of the shift register to the second bin with no change thereto. Functionally, this is again the behaviour (in terms of the data stored in the shift register 82) as would be observed in the embodiment shown in FIG. 3.

Discrepancy register D acts as a storage bin that stores a previous input presented to it, so acting as a one-cycle delay.

If there is a discrepancy between $d_1(n)$ and $d_2(n)$, then XOR gate K will provide a logic "1" to both the input of the discrepancy register and a second input of AND gate M. There are then two different scenarios.

1) If register D currently stores a "0" then there has been no discrepancy in the immediately previous set of data, and comparison unit 84 again acts to select either $d_1(n)$ or $d_2(n)$ for input to the shift register 82 as before. The "0" from the register D means that AND gate M will provide a "0" to XOR gate N, and data will flow through the shift register unaltered. The register D will however now be set to store a "1" due to the input from XOR gate K.

2) If register D currently stores a "1", (indicating that the immediately previous data $d_1(n-1)$ and $d_2(n-1)$ were not a match), then there will be two "1"s on the inputs to AND gate M, and hence its output will be a "1", and the action of XOR gate N will invert a data bit in the shift register 82 as it crosses from bin y(n-1) to y(n-2).

The action of XOR gate Q also means that the one of the inputs to the comparison unit 84 is also inverted, causing the two inputs to it to be the same, i.e. removing the discrepancy. Whichever input bit to the comparison unit is chosen, its output is therefore the same.

Thus, on detection of two adjacent discrepancies between $d_1(n)$ and $d_2(n)$ the logic circuit acts to alter previous decoded data bit y(n-1), thereby also removing the discrepancy in relation to the current bit. Because y(n-1) may be altered by this action, it is necessary to delay output of the decoded bits by taking y(n-1) from the point shown as the data output bit, which follows its optional inversion by XOR gate N.

This arrangement has been found to give a slightly improved performance under some circumstances, and the motivation for carrying out this inversion of the previous input bit to the shift register when successive discrepancies are found, is as follows.

There are two circumstances under which this successive-discrepancy situation may arise:

1. The previous decision, y(n-1), was wrong. If $d_1(n)$ would have been correct, that makes $d_1(n)$ wrong because of the feedback via the bottom left XOR gate in the first set 54 in the G1 path. Or,
2. There are genuinely single errors in the incoming signal in each successive pair of symbols.

Under some circumstances it is thought likely that the first situation is more likely to happen than the second. Under those circumstances (which may be gleaned by trial and error, simulation or analysis etc.) then the approach taken by the variant selector 82 as shown in FIG. 5 improves the result (as measured by the block error rate for a given Es/N0). Under circumstances where the first situation is not more likely to happen, then the embodiment of using the selector 62 as shown in FIG. 3 is preferred.

FIG. 4 shows in the plot of performance of this variant (marked with the upwardly directed triangles), compared with that of the embodiment of FIG. 3 (marked with circles) that, in simulations conducted by the inventor, the variant approach of FIG. 5 is slightly preferred.

To improve the performance of convolutional codes when the channel is subject to burst errors the well-known technique of interleaving can be used, as explained in for example J. G. Proakis "Digital Communications", $2^{nd}$ edition, section 5.2.10. The novel decoder presented herein benefits from being combined with interleaving in just the same way as Viterbi decoders do.

Embodiments of the invention may be employed in receivers of different types. For example, it may be used in radio receivers, such as GNSS receivers, short range receivers, for example Bluetooth®, WiFi®, Zigbee® receivers, or the like, or longer range radio communications systems such as in telephony and television broadcast systems. It may be used in acoustic, sonar or lidar applications. It may also be used in receivers that are coupled to a corresponding transmitter by a cable, or optical fibre, or wired networks etc.

Embodiments of the invention may be implemented either in hardware, software, or firmware. For example, it may be implemented using logic gates, either in discrete form or integrated in, for example, an FPGA or ASIC. Alternatively, it may be implemented in a digital signal processor device in software, or in a general purpose microprocessor.

The invention claimed is:

1. A decoder for decoding a convolutionally coded signal received by a receiver, the signal being represented as a multilevel signal where the number of levels is greater than two, the decoder comprising:
   a) a shift register having an input;
   b) a first one-bit quantizer, arranged to receive a first polynomial-derived multilevel signal that is a part of the multilevel signal as derived from a signal produced by a first polynomial during generation of the coded signal in a transmitter, and to produce a first quantized binary bit stream therefrom;
   c) a first set of at least one exclusive OR (XOR) gate(s) arranged to receive as input the first quantized binary bit stream, and to receive as further input(s) from bins from the shift register as determined by the first polynomial, the first set of XOR gates producing a first set output bit;
   d) a second one-bit quantizer, arranged to receive a second polynomial-derived multilevel signal that is a part of the multilevel signal as derived from a signal produced by a second polynomial during a coding stage in a transmitter, and to produce a second quantized binary bit stream therefrom;
   e) a second set of at least one XOR gate(s) arranged to receive as input the second quantized binary bit stream, and to receive as further inputs bins from the shift register as determined by the second polynomial, the second set of XOR gates producing a second set output bit;
   f) a selector, having as inputs the first and second polynomial-derived multilevel signals and the first and second set output bits, and being arranged to provide, as output to the shift register, either:
      i) if the value of the first and second set output bits are the same, then that value of the first and second set output bits, or
      ii) if the value of the first and second set output bits are different, then either the value of the first or second set output bit dependent upon a function of the first and second polynomial derived multi-level signals;
   wherein the decoder is further arranged to provide, as an output, a bit value provided to the input of the shift register.

2. A decoder as claimed in claim 1 wherein the function in (f) (ii) is one where the first set output bit is chosen if the absolute value of the first polynomial-derived multilevel signal exceeds the absolute value of the second polynomial-derived multilevel signal, or otherwise the second set output bit is chosen.

3. A decoder as claimed in claim 1 wherein the decoder has one or more additional quantizers, and sets of XOR gates, and inputs to a comparator to allow convolutional codes generated with more than two polynomials to be decoded.

4. A decoder as claimed in claim 1 wherein the multilevel signal is an analogue signal.

5. A decoder as claimed in claim 1 wherein the multilevel signal is a digitised signal having at least three quantization levels.

6. A decoder as claimed in claim 1 wherein the selector is adapted to have a discrepancy register, comprising of a memory store in which is stored a value representing whether there was a discrepancy in the immediately previous input from the first and second XOR sets, and further wherein the decoder is adapted to invert a bit in the shift register associated with the immediately previous input to the shift register as output from the selector if there is a current discrepancy between the outputs of the first and second XOR sets and the discrepancy register also indicates a discrepancy.

7. A receiver incorporating a decoder as claimed in claim 1.

8. A receiver as claimed in claim 7 wherein the receiver is a GNSS receiver.

9. A receiver comprising a decoder as claimed in claim 1, and arranged to implement a method for decoding a signal that has been convolutionally coded by a transmitter and received by a receiver, the signal being represented as a multilevel signal where the number of levels is greater than two, the method comprising the steps of,
   a) quantizing, in a first one-bit quantizer, a first polynomial-derived multilevel signal that is a part of the multilevel signal as derived from a signal produced by a first polynomial during generation of the coded signal in a transmitter, producing a first quantized binary bit stream therefrom;
   b) feeding the bit stream from (a) into a first set of at least one exclusive OR (XOR) gate(s), the set receiving further input(s) from bins of a shift register as determined by the first polynomial, the first set of XOR gates producing a first set output bit;
   c) quantizing, in a second one-bit quantizer, a second polynomial-derived multilevel signal that is a part of the multilevel signal as derived from a signal produced by a second polynomial during a coding stage in a transmitter, and producing a second quantized binary bit stream therefrom;
   d) feeding the bit stream from (c) into a second set of at least one XOR gate(s), the set receiving as further inputs bins from the shift register as determined by the second polynomial, the second set of XOR gates producing a second set output bit;
   e) selecting using a selector, having as inputs the first and second polynomial multilevel signals and the first and second set output bits, the first set output bit if the absolute value of the first polynomial multilevel signal exceeds the absolute value of the second polynomial-derived multilevel signal, or otherwise the second set output bit, and providing the selected bit as an input to the shift register;
   f) providing as a decoded output the bit output by a selected stage of the shift register.

10. A method for decoding a signal that has been convolutionally coded by a transmitter and received by a receiver, the signal being represented as a multilevel signal where the number of levels is greater than two, the method comprising the steps of,
    a) quantizing, in a first one-bit quantizer, a first polynomial-derived multilevel signal that is a part of the multilevel signal as derived from a signal produced by a first polynomial during generation of the coded signal in a transmitter, producing a first quantized binary bit stream therefrom;
    b) feeding the bit stream from (a) into a first set of at least one exclusive OR (XOR) gate(s), the set receiving further input(s) from bins of a shift register as determined by the first polynomial, the first set of XOR gates producing a first set output bit;

c) quantizing, in a second one-bit quantizer, a second polynomial-derived multilevel signal that is a part of the multilevel signal as derived from a signal produced by a second polynomial during a coding stage in a transmitter, and producing a second quantized binary bit stream therefrom;

d) feeding the bit stream from (c) into a second set of at least one XOR gate(s), the set receiving as further inputs bins from the shift register as determined by the second polynomial, the second set of XOR gates producing a second set output bit;

e) selecting using a selector, having as inputs the first and second polynomial multilevel signals and the first and second set output bits, the first set output bit if the absolute value of the first polynomial multilevel signal exceeds the absolute value of the second polynomial-derived multilevel signal, or otherwise the second set output bit, and providing the selected bit as an input to the shift register;

f) providing as a decoded output the bit output by a selected stage of the shift register.

11. A method as claimed in claim 10, the method further comprising storing, in a discrepancy register, a record of whether or not there is difference in the output of the first and second set output bits; and examining the discrepancy register and, if it indicates that the immediately prior outputs from the first and second set output bits differed, and also the current outputs of the first and second set output bits differ, inverting within the shift register the immediately prior bit provided to the input of the shift register.

* * * * *